United States Patent
Gibson et al.

(10) Patent No.: US 6,922,806 B2
(45) Date of Patent: Jul. 26, 2005

(54) METHOD AND SYSTEM FOR FAST FORWARD ERROR CORRECTION CODING AND DECODING

(75) Inventors: LeRoy A. Gibson, Riverton, UT (US); Roland R. Henrie, Provo, UT (US); Delon K. Jones, West Bountiful, UT (US)

(73) Assignee: L-3 Communications Corporation, New York, NY (US)

( * ) Notice: Subject to any disclaimer, the term of this patent is extended or adjusted under 35 U.S.C. 154(b) by 596 days.

(21) Appl. No.: 10/012,062

(22) Filed: Nov. 13, 2001

(65) Prior Publication Data

US 2003/0093754 A1 May 15, 2003

(51) Int. Cl.$^7$ ............................................. H03M 13/03
(52) U.S. Cl. ................................................... 714/786
(58) Field of Search ..................... 714/786, 751–755, 714/795, 746; 375/262, 341

(56) References Cited

U.S. PATENT DOCUMENTS

| | | | |
|---|---|---|---|
| 5,193,094 A | 3/1993 | Viterbi | 714/795 |
| 6,229,824 B1 * | 5/2001 | Marko | 370/477 |
| 6,285,681 B1 * | 9/2001 | Kolze et al. | 370/442 |
| 6,289,039 B1 * | 9/2001 | Garodnick | 375/143 |
| 6,700,881 B1 * | 3/2004 | Kong et al. | 370/335 |

OTHER PUBLICATIONS

Moher, M, Multiuser decoding for multibeam systems, Jul. 2000, IEEE Trans on Vehicular TEch., vol. 49, No. 4, p. 1226–1234.*
Lassing et al., Combined coding and spreading in downlink CDMA systems, 2000, IEEE, p. 2403–2407.*
Honda et al., DSD (Double soft decision) Concatenated FEC scheme in mobile satellite communication systems, Oct. 1992, IEEE Journal on Selected areas in Comm. vol. 10, No. 8, p. 12711277.*

* cited by examiner

Primary Examiner—Shelly A Chase
(74) Attorney, Agent, or Firm—Harrington & Smith, LLP

(57) ABSTRACT

A system for fast forward error correction coding and decoding is provided. The system includes a transmitting device having a data source and a forward error correction (FEC) encoder. The FEC is coupled to the data source and is adapted to encode packetized data from the data source. A channelizer is coupled to the at least one FEC encoder and is adapted to interleave the FEC encoded packetized data among a plurality of communication channels. The system also includes a receiving device adapted to receive the plurality of communication channels. The receiving device includes a dechannelizer, adapted to de-interleave the plurality of communication channels and a FEC decoder to reconstituted the packetized data.

30 Claims, 5 Drawing Sheets

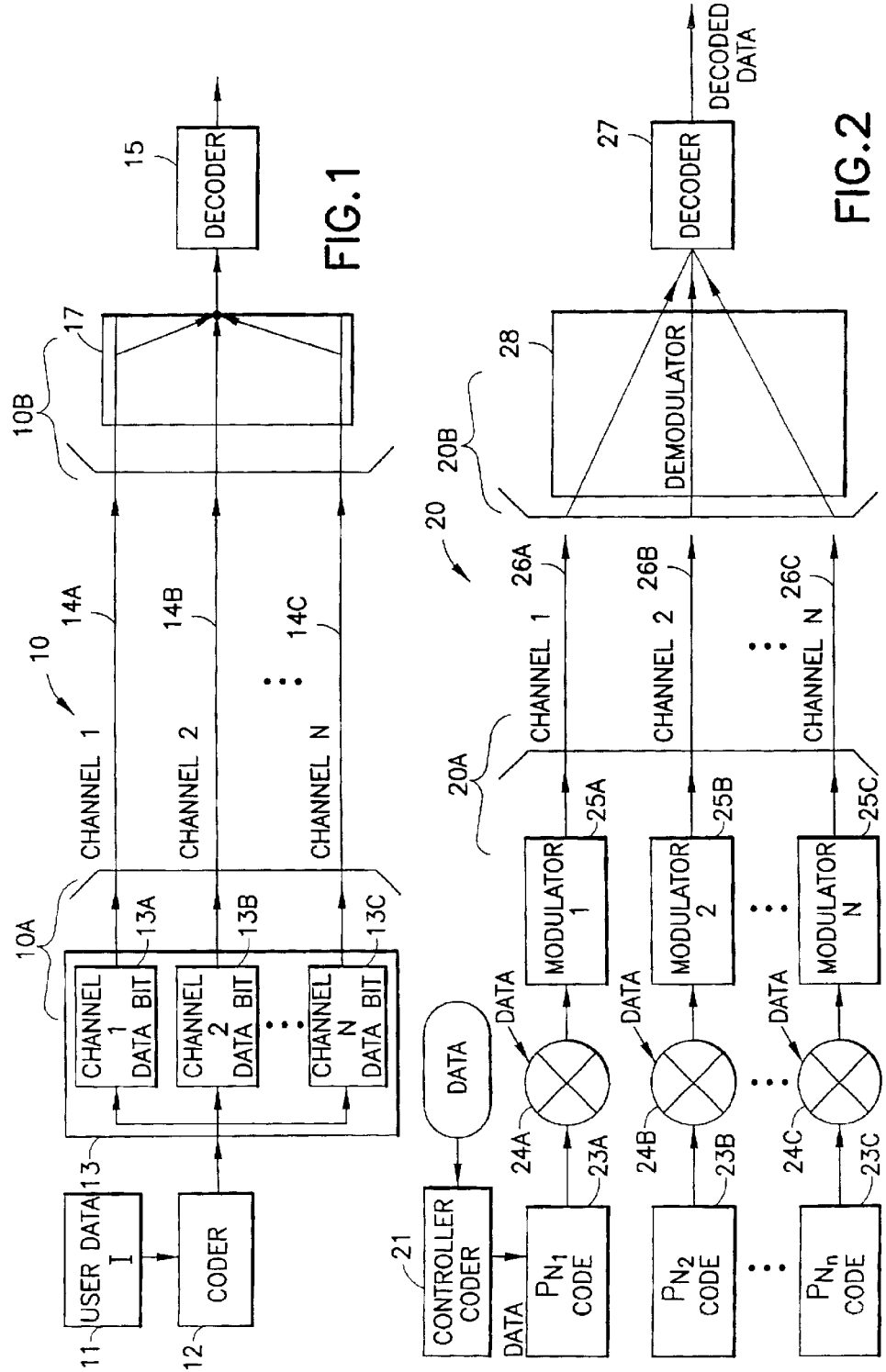

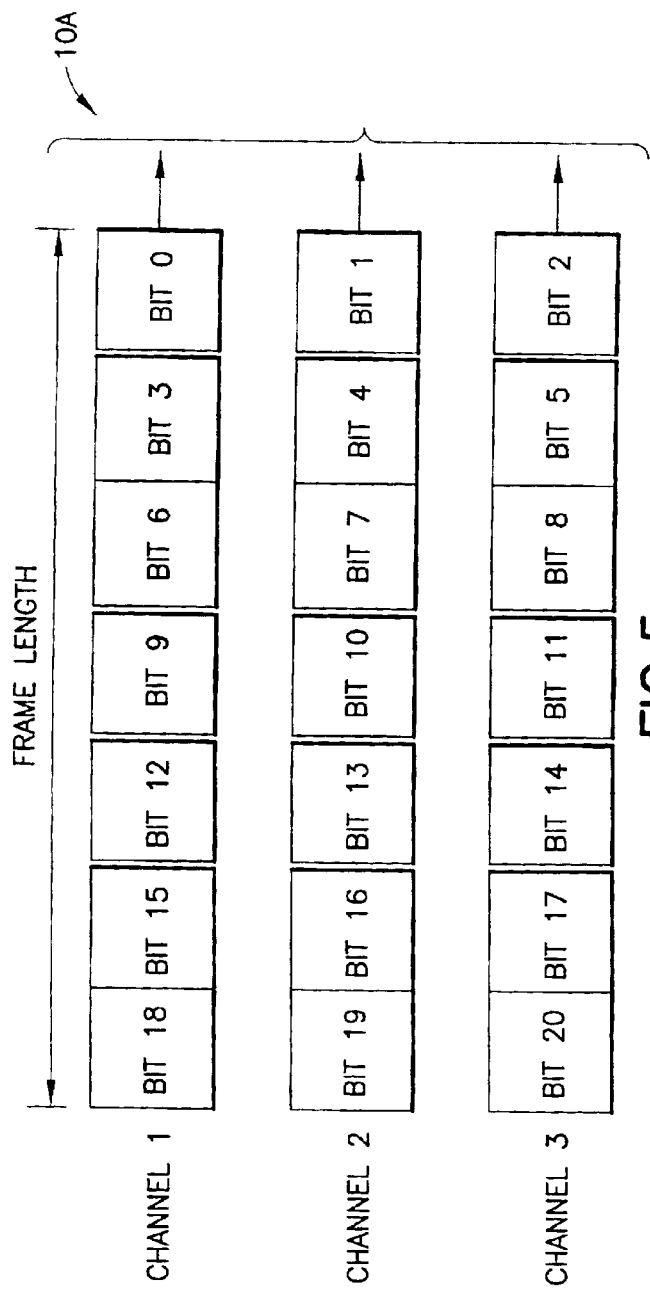
FIG.5
FIG.5A

METHOD AND SYSTEM FOR FAST FORWARD ERROR CORRECTION CODING AND DECODING

BACKGROUND OF THE INVENTION

1. Field of the Invention

The present invention relates to data coding and decoding and, more particularly, to methods and systems for fast forward error correction (FFEC) coding and decoding.

2. Prior Art

Forward Error Correction (FEC) is a commonly used technique for transmitting data such that transmission errors may be minimized. FEC coding redundantly codes each bit to allow a receiving decoder to detect and correct transmission errors. FEC coding has several advantages over other types of error correction such as Automatic Request to Retransmit (ARQ). For one, FEC methods do not require that the data be retransmitted, possibly several times, before the data is received without error. This can greatly improve throughput of the transmission link. Also, since the receiver does not have to request retransmission it is possible to use one way or simplex data links and receive only terminals or devices.

However, in many systems or devices where the data is transmitted in a burst fashion, such as asynchronous transfer mode (ATM) packets, the data must be FEC decoded before the next packet arrives in order to timely retrieve control information. Yet most decoders, such as the commonly used Viterbi decoder, require initialization, which means that the first bits in a burst cannot be decoded unless a known preamble is used. In addition, initialization requires a finite period of time before being able to start to decode the data. Thus, decoding the data before the next transmission burst is received could severely strain the resources of the device if the time to fully decode the data is close to a burst length.

Not excluding another disadvantage, the FEC decoders have a limit as to the number of errors within a transmission for which they can correct. Thus, a burst transmission traveling over a channel may experience degradation across a substantial portion of the burst length, degradation for which a FEC decoder may not be able to correct for.

Therefore, it is desirable to provide a method and system for fast forward error correction coding and decoding that overcomes the disadvantages noted above.

SUMMARY OF THE INVENTION

The foregoing and other problems are overcome, and other advantages are realized, in accordance with the presently preferred embodiments of these teachings.

In accordance with one embodiment of the invention a system for fast forward error correction coding and decoding is provided. The system includes a transmitting device having a data source and a forward error correction (FEC) encoder. The FEC encoder is coupled to the data source and is adapted to encode packetized data from the data source. A channelizer is coupled to the FEC encoder and is adapted to interleave the FEC encoded packetized data among a plurality of communication channels. The system also includes a receiving device adapted to receive the plurality of communication channels. The receiving device includes a dechannelizer adapted to de-interleave the plurality of communication channels and a FEC decoder.

In accordance with another embodiment a communications system for fast forward error correction coding and decoding is provided. The communications system includes a transmission device having a data source and a controller coder adapted to FEC encode data from the data source and interleave the FEC encoded data amongst a plurality of PN spreaders. The plurality of PN spreaders includes a plurality of PN code generators where each of the PN codes is substantially mutually orthogonal. The transmission device also includes a plurality of modulators adapted to modulate the interleaved and PN code spread encoded data from the PN spreaders onto a carrier frequency or group of carrier frequencies. The communications system also includes a receiving device adapted to receive and demodulate the carrier frequency or frequencies. A receiver de-interleaver reconstructs the FEC encoded data, which is then decoded by a FEC decoder.

The invention is also directed towards a method for fast forward error correction (FFEC) coding and decoding. The method includes the steps of retrieving user data and encoding the user data according to a FEC scheme. The FEC encoded data is interleaved amongst a plurality of transmission channels and transmitted to a receiver. The receiver, adapted to receiving multiple channels, de-interleaves the FEC encoded data and FEC decodes the FEC encoded data to reconstruct the user data.

BRIEF DESCRIPTION OF THE DRAWINGS

The foregoing aspects and other features of the present invention are explained in the following description, taken in connection with the accompanying drawings, wherein:

FIG. 1 is block diagram of a system incorporating features of the present invention;

FIG. 2 is a block diagram of a PN communications system incorporating features of the present invention;

FIG. 5 is a block diagram illustrating an example of the forward link-timing diagram shown in FIG. 4;

FIG. 5A is a block diagram representing a 21-bit packet example as used in FIG. 5.

DETAILED DESCRIPTION OF THE PREFERRED EMBODIMENT

Figure 3:
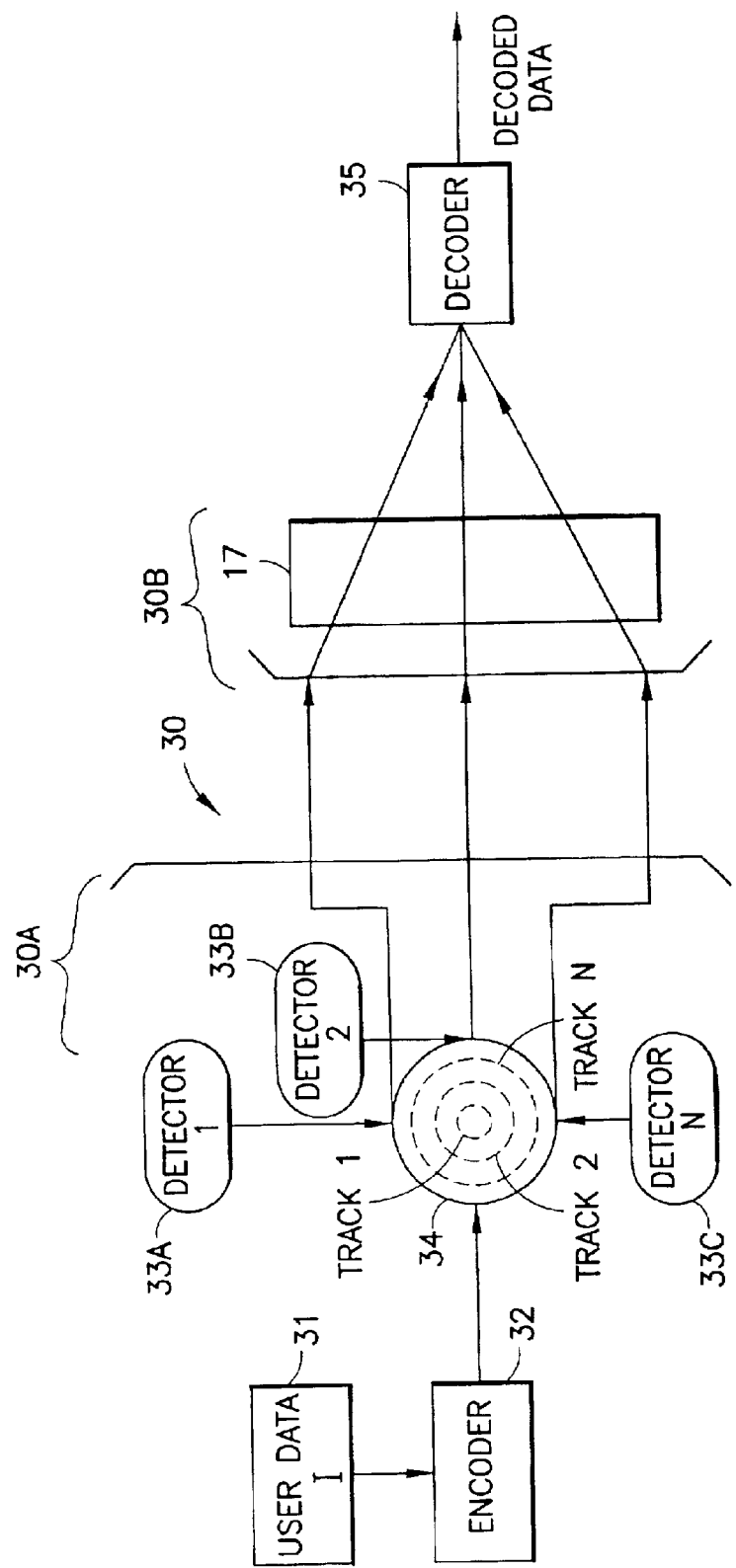
FIG. 3 is a block diagram of a recording/playback system incorporating features of the present invention.

Referring to FIG. 1, there is shown a block diagram of a system incorporating features of the present invention. Although the present invention will be described with reference to the embodiments shown in the drawings, it should be understood that the present invention could be embodied in many alternate forms of embodiments. For example, features of the present invention may be employed to reduce data packet loss through communication systems such as local area networks (LANS) or wide area networks (WANs). Referring still to FIG. 1, wherein the transmission device 10A includes a packet of user data 11 coupled to coder 12. Coder 12 encodes the data using suitable FEC coding techniques. Coder 12 may be any suitable encoder, such as a convolutional encoder, with any suitable coding Rate (R).

Figure 4:
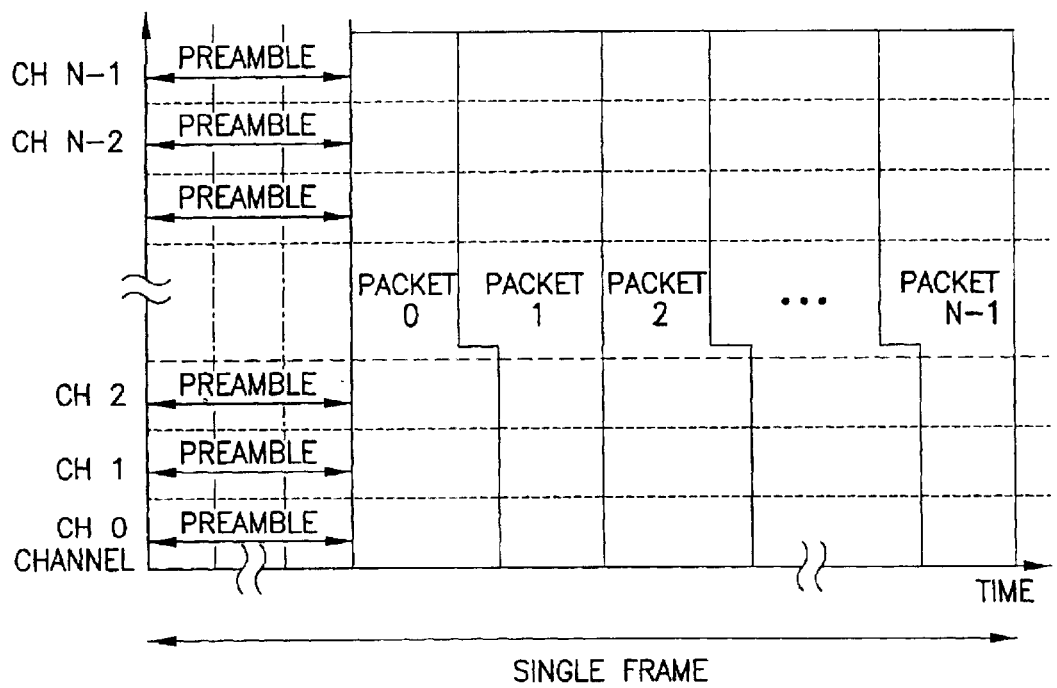
FIG. 4 is forward link timing diagram illustrating features of the present invention shown in FIG. 1.

The encoded data from coder 12 is coupled to channelizer 13, which interleaves the coded packet data across multiple transmission channels 14A–14C. In the preferred embodiment a packet length substantially corresponds to an integer multiple of the channel's frame length such that packet data bits distributed across multiple channels fit within a receiver's burst receive time; thus avoiding having to wait for a subsequent burst to finish decoding the packet. Referring also to FIG. 4 there is shown a forward link-timing diagram of the communications system shown in FIG. 1. It will be appreciated that in alternate embodiments channelizer 13 may interleave the coded packet data across the multiple channels in any suitable arrangement. For example, a coded packet containing 7 encoded bits, where the convolutional coding Rate=⅓, for a total of 21 bits (FIG. 5A) may be distributed across 3 channels of 7 bits/frame in an interleaved fashion. An example of an interleaved distribution is shown in FIG. 5. It will be further appreciated that any suitable FEC encoding may be used as well as any suitable distribution across available channels. Referring still to FIG. 5 as an example, it will be further appreciated that each encoded bit (bit not shown) is represented by the encoded bit groups 1–7. $Bit_0$, $Bit_1$, and $Bit_2$ representing an encoded bit are distributed across channels 1–3. Likewise, the remaining $Bits_3$–$Bit_{20}$, are distributed across channels 1–3 in an interleaving fashion. The preferred embodiment interleaves the FEC encoded data across twenty channels. In alternate embodiments any suitable number of channels may be used. It will be recognized that the number of channels, burst times, and bits per burst, may be suitably adjusted to mitigate transmission loss. For simple illustration, in a twenty-channel system with a one-bit/burst per channel any one channel could be corrupted without loss of the data since that no one encoded group lies entirely within one channel, thus increasing the likelihood that most of the encoded bits will reach the receiver. It will also be appreciated that the encoded bits may be suitably interleaved within a packet longer than one-bit to further minimized data loss or undesirable detection. Transmitter 10A transmits the channels with the FEC encoded and interleaved data to receiver 10B. The transmitter 10A may be any suitable transmitter such as code division multiple access (CDMA) or time division multiple access (TDMA) transmitter system.

Referring still to FIG. 5, it will also be recognized that the burst frame length is, in this example, equal to a packet length of 7-bits represented by the seven encoded bit groups 1–7. This allows the decoder 15 in receiver 10B to receive and decode the encoded groups in order to retrieve the desired 7-bits before a subsequent transmission burst. In alternate embodiments, the packet may contain control information necessary to receive the subsequent transmission burst; accordingly it is advantageous to decode the packet before the next packet is received. In a preferred embodiment the packet length is substantially 56 bytes; however, in alternate embodiments any suitable packet length may be used.

Receiver 10B receives the multiple channels and couples the data to de-channelizer 17 which restructures the multiple channel frame data into the original encoded packet containing groups 1–7. In an alternate embodiment the channel frame data could be parallel coupled to decoder 15. Decoder 15 may be any suitable FEC decoder, 20 such as, for example, a hard decision Viterbi decoder, a soft decision Viterbi decoder, or a Reed/Solomon decoder. The output of decoder 15 is the original data before being encoded by coder 12.

Referring to FIG. 2 there is shown a block diagram of an 25 alternate embodiment of the present invention. In this embodiment data 22 is encoded by controller coder 21 and then spread by mixers $24_A$–$24_C$ with a pseudo-noise code from PN code generators $23_A$–$23_C$. In alternate embodiments any suitable orthogonal code generators may be used. Modulators 25A–25C modulate the data for transmission to receiver 20B. Controller 21 codes and interleaves the data 22 in a fashion similar to the example shown in FIGS. 5 and 5A. For example, $Bit_0$ of the encoded bit group 1 is spread by PN1 code for subsequent transmission on channel 1. Likewise, $Bit_1$ of the encoded bit group 1 is spread by Pn2 code for subsequent transmission on channel 2. This interleaving and spreading is continued for the rest of the bit groups in the packet in a likewise manner.

Figure 6:
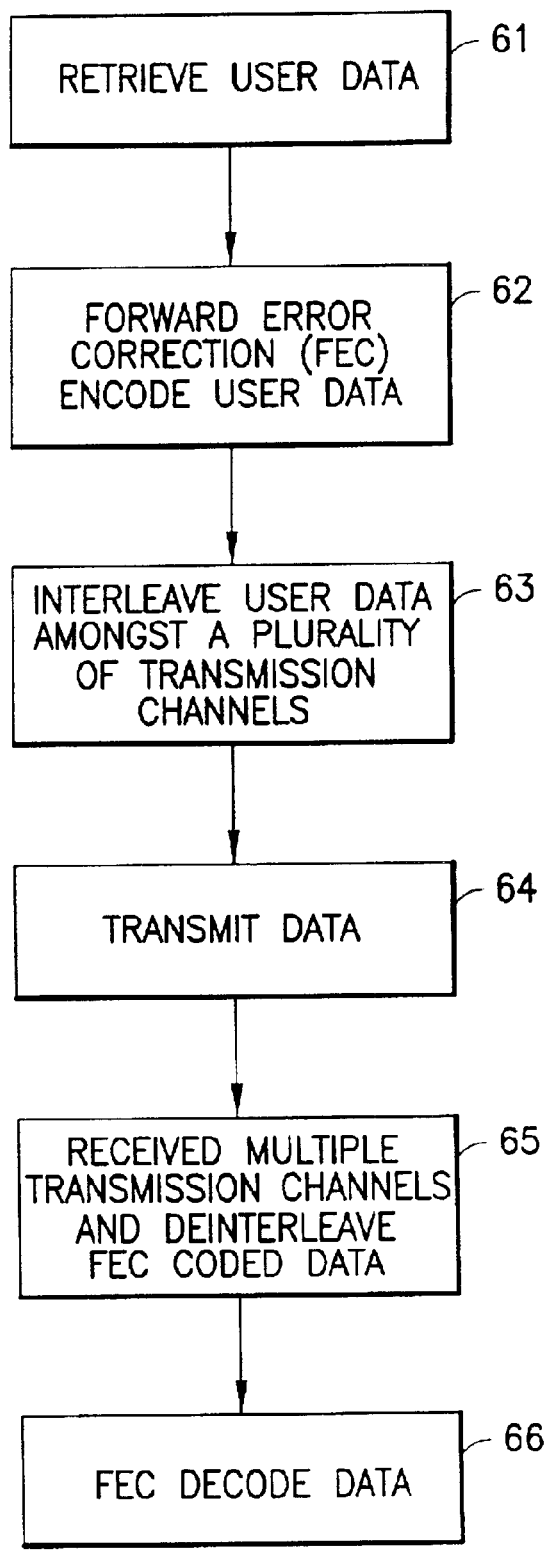
FIG. 6 is flow chart of one method for implementing features of the present invention as shown in FIG. 1.

Referring to FIG. 6 there is shown a flow chart of one method for implementing features of the present invention as shown in FIG. 1. Step 61 retrieves user data that is then FEC encoded according to a predetermined FEC scheme, such as convolutional, punctured convolutional, or block FEC encoding. The FEC encoded data is then interleaved, step 63, amongst a plurality of transmission channels. The interleaving may be any suitable arrangement according to the number of available channels, transmission burst times, and bits/hurst. Step 64 transmits the data via the transmission channels to a receiver. The transmissions may be any suitable transmissions such as, for example, Direct Spectrum-CDMA, Frequency Hop-CDMA, or TDMA transmissions. Step 65 receives the transmitted channels and de-interleaves the FEC encoded data. Step 66 decodes the FEC encoded data to produce the original user data. It is appreciated that the entire FEC encoded user data is received and decoded before a subsequent transmission burst; this advantageously allows the decoder to decode the user data without having to wait for a subsequent burst thus increasing system throughput. In alternate embodiment, a placement of control data, control cells, or an ATM frame, near the beginning of a receive frame lets the control data, or ATM frame, be decoded through the FEC decoder before the next transmit frame and, if necessary, a transmit frame can be controlled by the last receive frame. It will be appreciated that if one or more channels are jammed or fades then only part of the control frame, or ATM frame, is lost; thus the system bit error rate is improved.

Another exemplary, but not limiting embodiment, includes communication systems incorporating recording and playback devices such as Compact Disk (CD) recorders or Digital Video Disks (DVD) recorders and their respective playback devices. In the CD or DVD embodiments, data is suitably FEC encoded and stored in multiple positions around a CD/DVD ring or group of rings. Retrieval of the data in playback mode is similar to burst transmission nature of a transmission communications system; and thus the features of the present invention may be employed to minimize data corruption arising from disk scratches or temporary disk/detector misalignment such as may occur when carrying the device.

Referring to FIG. 3 there is shown a block diagram of an alternate embodiment of the present invention. Here, user data 31 is FEC encoded by encoder 32 and interleaved on a recordable media 34 in communication system 30A. The encoder may be any suitable encoder such as, for example, a convolutional encoder. The recordable media may be any suitable media such as a CD or DVD. The data is interleaved around the media on recordable circular tracks; where for purposes of illustration each track may be considered a channel and each track has multiple recordable arc lengths equivalent to a burst frame length.

Each track has an associated detector 33A–33C which may be fixed or moveable. The detectors sense the encoded data residing in a particular arc length and parallel transmit the sensed data to a receiver 30B containing decoder 35 contained in communication system 30B. Decoder 35 decodes the data according to suitable FEC decoding techniques and forwards the decoded data to appropriate circuitry (not shown). It is appreciated that an area of a recording track may suffer from physical destruction, i.e., a scratch, yet the data redundantly encoded and interleaved amongst multiple arcs and tracks may still be recovered.

It should be understood that the foregoing descriptions are only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A system for fast forward error correction coding and decoding, the system comprising:
   a transmitting device, wherein the transmitting device comprises:
   a data source;
   at least one forward error correction (FEC) encoder couple to the data source, wherein the at least one FEC encoder is adapted to encode data from the data source;
   a channelizer coupled to the at least one FEC encoder, wherein the channelizer is adapted to interleave the encoded data among a plurality of communication channels;
   wherein the data source is adapted to place control information prior to other information so that the control information is encoded and interleaved prior to the other information;
   at least one receiving device, the at least one receiving device adapted to receive the plurality of communication channels, wherein the receiving device comprises:
   a dechannelizer, wherein the dechannelizer is adapted to de-interleave the plurality of communication channels; and
   a decoder coupled to the dechannelizer.

2. A system as in claim 1 wherein the at least one FEC encoder comprises a convolutional FEC encoder.

3. A system as in claim 2 wherein the convolutional FEC encode comprises a punctured convolutional FEC encoder.

4. A system as in claim 1 wherein the at least one FEC encoder comprises a block FEC encoder.

5. A system as in claim 1 wherein the decoder comprises a Viterbi decoder.

6. A system as in claim 5 wherein the Viterbi decoder comprises a hard decision Viterbi decoder.

7. A system as in claim 5 wherein the Viterbi decoder comprises a soft decision Viterbi decoder.

8. A communications system for fast forward error correction coding and decoding, the communications system comprising:
   a transmission device, the transmission device comprising:
   a data source;
   a controller coder, wherein the controller coder is adapted to encode data from the data source;
   a plurality of pseudo-noise (PN) code generators;
   a plurality of mixers, the plurality of mixers adapted to spread encoded data from the controller coder, wherein the controller coder is further adapted to interleave the encoded data amongst the plurality of mixers according to a predetermined arrangement;
   a plurality of modulators, the plurality of modulators adapted to modulate the interleaved PN code spread encoded data from the plurality of mixers onto at least one carrier frequency;
   wherein the data source is adapted to place control information prior to other information so that the control information is encoded and interleaved prior to the other information;
   a receiving device adapted to receive the at least one carrier frequency, wherein the receiving device comprises:
   at least one decoder, wherein the at least one decoder comprises:
   a plurality of PN code despreaders;
   a de-interleaver coupled to the plurality of PN code despreaders, wherein the de-interleaver is adapted to reconstitute the encoded data from the data source; and
   a FEC decoder.

9. A communications system as in claim 8 wherein the controller coder comprises a block FEC encoder.

10. A communications system as in claim 8 wherein the controller coder comprises a convolutional FEC encoder.

11. A communications system as in claim 8 wherein each of the plurality of PN code generators comprise a PN code substantially mutually orthogonal with each of the other PN codes.

12. A communications system as in claim 8 wherein the transmission device comprises a direct sequence code division multiple access (DS-CDMA) communications system.

13. A communications system as in claim 8 wherein the transmission device comprises a frequency hop code division multiple access (FH-CDMA) communications system.

14. A communications system as in claim 8 wherein the at least one decoder is a Viterbi decoder.

15. A method for fast forward error correction (FFEC) coding and decoding, the method comprising the steps of:
   placing, in user data, control information prior to other information;
   retrieving the user data;
   encoding the user data according to a FEC scheme;
   interleaving the FEC encoded data amongst a plurality of transmission channels;
   transmitting the FEC encoded data, whereby the encoded and interleaved control information is transmitted prior to the encoded and interleaved other information;
   receiving the plurality of transmission channels;
   de-interleaving the FEC encoded data; and
   FEC decoding the FEC encoded data to produce the user data.

16. A method as in claim 15 wherein the step of encoding the user data according to the FEC scheme further comprises the step of block FEC encoding the user data.

17. A method as in claim 15 wherein the step of encoding the user data according to the FEC scheme further comprises the step of convolutional FEC encoding the user data.

18. A method as in claim 15 wherein the step of transmitting the FEC encoded data further comprises the step of transmitting the FEC encoded data within a predetermined time frame.

19. A method as in claim 15 wherein the step of FEC decoding the FEC encoded data to produce the user data further comprises the step of Viterbi FEC decoding the FEC encoded data.

20. A method as in claim 15 wherein the step of FEC decoding further comprises the step of Reed/Solomon FEC decoding the FEC encoded data.

21. A method for interleaving FEC coded packet data across multiple channels, the method comprising the steps of:

providing N transmission channels, where each N transmission channel comprises a transmit frame;

inserting channel preambles on each transmit frame; and distributing next, after the channel preambles, the FEC packet data across each transmit frame, wherein the FEC packet data has control information placed prior to other information so that the control information is distributed prior to the other information.

22. A method as in claim 21 wherein the step of distributing, after the channel preambles, the FEC coded packet data across each transmit frame further comprises the step of distributing, FEC coded ATM packet data.

23. A method as in claim 21 wherein the step of distributing after the channel preambles, the FEC coded packet data across each transmit frame further comprises the step of distributing FEC coded control data.

24. A system for fast forward error correction data coding and decoding, the system comprising:

a communications device, wherein the communications device comprises:

a recordable media, the recordable media comprising a plurality of recordable tracks around which encoded packetized data may be interleaved;

a plurality of detectors adapted to read the interleaved encoded packetized data from the plurality of recordable tracks;

at least one receiving device, the at least one receiving device adapted to receive the interleaved encoded packetized data from the plurality of detectors, wherein the receiving device comprises:

a dechannelizer, wherein the dechannelizer is adapted to de-interleave the encoded packetized data from the plurality of detectors; and a decoder coupled to the dechannelizer.

25. A system as in claim 24 further comprising:

a data source; and at least one forward error correction (FEC) encoder coupled to the data source, wherein the at least one FEC encoder is adapted to encode packetized data from the data source.

26. A transmitting device that operates on data, the transmitting device comprising:

means for storing data, the means for storing placing control information in the data prior to placing other information in the data;

means for encoding the data, the means for encoding coupled to the means for storing data; and means for interleaving the encoded data among a plurality of communication channels, the means for interleaving coupled to the means for encoding, whereby the control information is encoded and interleaved prior to the other information.

27. The transmitting device of claim 26, wherein the transmitting device further comprises means for creating a single frame and means for placing the control information near a beginning of the single frame, wherein the single frame comprises a transmit frame on each of the communication channels.

28. A receiving device comprising:

means for de-interleaving data received from a plurality of communication channels, the received data having control information placed prior to other information so that the control information is received prior to the other information; and means, coupled to the means for de-interleaving, for decoding the control information prior to decoding the other information.

29. The receiving device of claim 28, wherein the receiving device further comprises means for receiving a single frame, the single frame having the control information placed near a beginning of the single frame, wherein the single frame comprises a transmit frame on each of the communication channels.

30. A transmitting device that operates on data, the transmitting device comprising:

means for placing asynchronous transfer mode (ATM) information in the data prior to placing other information in the data;

means, coupled to the means for placing, for encoding the data; and means, coupled to the means for encoding, for interleaving the encoded data among a plurality of communication channels, whereby the ATM information is encoded and interleaved prior to the other information.

* * * * *

UNITED STATES PATENT AND TRADEMARK OFFICE
CERTIFICATE OF CORRECTION

PATENT NO. : 6,922,806 B2
DATED : July 26, 2005
INVENTOR(S) : Gibson et al.

It is certified that error appears in the above-identified patent and that said Letters Patent is hereby corrected as shown below:

Column 5,
Line 21, "couple" should be deleted and -- coupled -- should be inserted.
Line 43, "encode" should be deleted and -- encoder -- should be inserted.

Signed and Sealed this

Eighteenth Day of October, 2005

JON W. DUDAS
*Director of the United States Patent and Trademark Office*